United States Patent

Buchi et al.

Patent Number: 6,056,108
Date of Patent: May 2, 2000

[54] IMPULSE-BASED, FLEXIBLE PARTS FEEDER

[75] Inventors: Felix Buchi, Los Gatos; Issa Nesnas, La Crescenta; Brian R. Carlisle, Palo Alto, all of Calif.

[73] Assignee: Adept Technology, Inc., San Jose, Calif.

[21] Appl. No.: 08/971,672

[22] Filed: Nov. 17, 1997

[51] Int. Cl.[7] .................................................. B65G 39/10
[52] U.S. Cl. ........................................................... 198/395
[58] Field of Search .............................. 198/395; 221/163, 221/157

[56] References Cited

U.S. PATENT DOCUMENTS

| | | | |
|---|---|---|---|
| 2,877,884 | 3/1959 | Esenwein | 198/33 |
| 3,823,815 | 7/1974 | Bretten et al. | 198/33 R |
| 3,848,724 | 11/1974 | Belk | 198/431 |
| 3,881,605 | 5/1975 | Grossman | 214/1 CM |
| 4,014,460 | 3/1977 | Bryan, Jr. | 221/156 |
| 4,164,279 | 8/1979 | Bubuit | 198/468.6 |
| 4,262,793 | 4/1981 | Hebenstreit et al. | 198/431 |
| 4,284,187 | 8/1981 | Kramer et al. | 198/435 |
| 4,460,108 | 7/1984 | Noda et al. | 221/94 |
| 4,465,174 | 8/1984 | Uhl | 198/361 |
| 4,619,356 | 10/1986 | Dean et al. | 198/395 |
| 4,678,073 | 7/1987 | Anderson et al. | 198/396 |
| 4,690,266 | 9/1987 | Croman et al. | 198/388 |
| 4,697,689 | 10/1987 | Carrell | 198/394 |
| 4,811,831 | 3/1989 | Honkomp et al. | 198/394 |
| 4,819,784 | 4/1989 | Sticht | 198/395 |
| 4,829,748 | 5/1989 | Uehira et al. | 53/525 |
| 4,835,730 | 5/1989 | Shimano et al. | 364/513 |
| 4,876,728 | 10/1989 | Roth | 382/21 |
| 4,909,376 | 3/1990 | Herndon et al. | 198/395 |
| 4,917,562 | 4/1990 | Colli et al. | 198/444 |
| 5,084,959 | 2/1992 | Ando et al. | 29/740 |
| 5,105,930 | 4/1992 | Spatafora et al. | 198/453 |
| 5,205,396 | 4/1993 | Grecksch et al. | 198/577 |
| 5,305,427 | 4/1994 | Nagata | 395/94 |
| 5,314,055 | 5/1994 | Gordon | 198/395 |
| 5,314,293 | 5/1994 | Carlisle et al. | 414/744.5 |
| 5,589,942 | 12/1996 | Gordon | 356/376 |

FOREIGN PATENT DOCUMENTS

| | | | |
|---|---|---|---|
| 2632480 | 12/1989 | France . | |
| 3817465 | 11/1989 | Germany . | |
| 56-98155 | 8/1981 | Japan . | |
| 1452769 | 1/1989 | U.S.S.R. | 198/395 |
| 2167211 | 5/1986 | United Kingdom | 198/395 |
| 92003364 | 3/1992 | WIPO | 198/395 |
| WO 92/03364 | 3/1992 | WIPO . | |

OTHER PUBLICATIONS

Schimmels et al., "The Robustness of an Admittance Control Law Designed for Force Guided Assembly to the Disturbance of Contract Friction", May 1992, pp. 2361–2366, Proceedings of the 1992 IEEE Internatinal Conference on Robotics and Automation.

Rao et al., "Orienting Generalized Polygonal Parts", May 1992, pp. 2263–2268, Proceedings of the 1992 IEEE International Conference on Robotics and Automation.

Farnum, "Delivering the Part", Mar. 1986, Manufacturing Engineering.

Murch et al., "Predicting Efficiency of Parts Orienting Systems", pp. 55–57, Automation, Feb. 1971.

(List continued on next page.)

*Primary Examiner*—William E. Terrell
*Assistant Examiner*—Khoi H. Tran
*Attorney, Agent, or Firm*—Oliff & Berridge, PLC

[57] ABSTRACT

A flexible parts feeder includes a flexible membrane for supporting parts and defining a selection zone where the positional state of parts is analyzed by a machine vision system. The output of the sensor is used to control a transformer that selectively applies impulse energy to the flexible membrane so as to change the positional states of at least some parts in the selection zone to a desired positional state. Those parts having the desired positional state are selected and removed from the membrane by a robot.

42 Claims, 10 Drawing Sheets

OTHER PUBLICATIONS

Zenger, D., Dewhurst, P., Automatic Handling of Parts for Robot Assembly, Annals of CIRP, v. 33, No. 1, 1984.

Maul, G.P., Goodrich, J.L., A Methodology for Developing Programmable Parts Feeders, IIE Trans., v. 15, No. 4, 1983.

Suzuki, T. Kohno M., The Flexible Parts Feeder Which Helps a Robot Assemble Automatically, Assembly Automation, v. 1, No. 2, 1981.

Cowart, N.A., et al., Programmable Assembly Research, Technology Transfer To Industry–Phase II, Westinghouse R & D Center, ISP 78–18773, Pittsburgh, 1981.

Kim et al., "A Shape Metric for Design–for–Assembly", May 1992, pp. 968–973, Proceedings of the 1992 IEEE International Conference on Robotics and Automation.

Brokowski et al., "Curved Fences for Part Alignment", 1993 IEEE International Conference on Robotics and Automation, (pp. 3/467–3/473).

IMPULSE-BASED, FLEXIBLE PARTS FEEDER

BACKGROUND OF THE INVENTION

1. Field of Invention

The invention relates to parts feeders, and more particularly to feeders capable of analyzing small, electronic, mechanical or food parts or other objects in a selection zone and, if required, reorienting the parts to a desired orientation.

2. Description of Related Art

To automate the assembly of mechanical components, parts must be precisely oriented prior to packing or insertion. The manufacturing industry currently relies on passive parts feeders using handcrafted mechanical "filters" that admit only those parts having a desired orientation. Rejected parts are recycled for another pass through the orientation mechanism. When part geometry changes, the "filter" must be mechanically redesigned, involving a trial-and-error process typically requiring several months and up to 50% of the costs of the automated assembly cell.

Currently, the most common method for orienting parts is a vibratory bowl feeder, in which parts in a specially configured bowl are vibrated with a rotary motion so that they climb a helical track. As they climb, a sequence of baffles and cut-outs in the track creates a mechanical "filter" that causes parts in all but one orientation to fall back into the bowl for another attempt at achieving a desired orientation. It is also possible to design the track to mechanically rotate parts into a desired orientation. Other orientation methods use centrifugal forces, belts, or reciprocating forks, rather than vibration, to move parts through the part-feeding mechanism.

When part geometry changes in a bowl feeder, specialists must redesign the bowl and/or other components of the mechanism to accommodate the new parts. The mechanism must be tested and modified numerous times to achieve the best feeding efficiency and to eliminate jams. Jams are, for example, caused by the fact that reorientation and "filtering out" of parts by means of baffles and cut-outs in the track most often rely on external, loose tolerances or uncontrolled part features.

Another prior art feeder uses an array of nests (silhouette traps) cut into a vibrating plate. The plate and nests vibrate so that parts will remain in the nests only in a particular orientation. By tilting the plate and letting parts flow across it, the nests eventually fill up with parts in the desired orientation. Although the vibratory motion is under software control, specialized mechanical nests must still be designed for each new type of part, and jamming and improper part alignment in the nests are problems, as with bowl feeders. Several other designs for programmable parts feeders have been proposed, in which programmed vibration is used to drive parts into a stable orientation. These methods are useful for bringing parts into "low-energy" positions and orientations, where their respective centers of mass are as low as possible, but other methods are then required to further orient the parts relative to a selection plane.

Sensors, such as tactile probes, photocells, fiber optic sensors and vision systems, have been used to determine the position and orientation of parts delivered by a vibratory track. Once part position and orientation are determined, air jets and trap doors are used to group parts in similar positions and orientations. Difficult and time-consuming physical changes must be made in the components of such systems when part type changeover is desired.

For decades, researchers have studied the "bin picking" problem, that is, the problem of picking a part out of a bin of jumbled parts. Due to the difficulty of recognizing overlapping parts in arbitrary orientations, few of these systems have been adopted for industrial applications. Standard vision systems, however, are often successful when additional constraints are imposed, such as presenting parts in isolation on a flat surface. U.S. Pat. No. 4,876,728 to Roth, which is incorporated herein by reference, discloses an improved vision system for distinguishing touching parts on a conveyor. The vision system processes binary images and recognizes objects based on boundary features, such as lines, arcs, corners and holes, instead of "blob features." The system is interfaced to a robot system and can recognize up to five parts per second. The ability of the vision system to quickly and reliably recognize parts is still dependent, though, on the orientation and degree of overlap of the parts being inspected.

Unlike bowl feeders, which present parts in their final desired orientation, parts presented on flat conveyor surfaces, such as shown in Roth, may lie in one of several stable states. Typically, these stable states are not the desired final orientation for the parts. In general, the parts may require translation and rotation through six degrees of freedom in order to reach their final orientation and destination. While it is possible to use a conventional six axis robot to acquire parts from the flat conveying surface, in general, such robots are not as cost effective, fast, or precise as robots having less degrees of freedom. These drawbacks of the six axis robot decrease the overall effectiveness of the parts feeder.

In addition, six axis robots generally have their three axes of rotation of the wrist intersecting at a single point. This results in a substantial distance between these axes of rotation and the tip of the robot fingers due to the volume required by the wrist and the offset for the fingers. This wrist and finger arrangement has the following drawbacks. First, use of this arrangement will require the designation of a substantial area for the part selection zone so that the wrist and finger arrangement can be properly manipulated to pick up a part. This leads to an overly large-construction of the parts feeder. Second, because some applications will require, during part pick-up, that the longitudinal axes of the fingers be inclined relative to the conveyor surface in order to properly reposition the part, the ability of the gripper to select a part from among a plurality of parts crowded together may be significantly impaired. Third, because the above wrist and finger arrangement has at least two of the three axes of rotation displaced substantially from the center of the picked part, repositioning of the part to its drop or assembly location may require the fingers to assume a position which impedes or prevents final positioning or assembly.

Parts feeders; are known that convey parts through a selection zone, where parts are analyzed by a machine vision system and properly oriented parts are removed by a robot. An example of such a parts feeder developed by the assignee of the present invention is disclosed in U.S. application Ser. No. 08/428,679, filed Apr. 25, 1995, which is incorporated herein by reference. As shown in the aforementioned application, parts are presented at random orientations and positions on a conveyor to the vision system. Non-selected parts are recirculated through the selection zone after being vibrated or otherwise induced to assume new orientations, until the parts are selected.

When parts are scattered onto the selection zone, they end up in various stable states. In order to achieve the desired throughput, the vision system is programmed to identify stable states with a high probability. In general, those high probability stable states are not identical with the desired assembly orientation. As a result, a secondary operation is often needed to transform the part to the desired assembly or place of orientation. This secondary transformation operation is typically performed by the robot itself and/or the part is placed on an external flip station and subsequently picked up again by the robot. As a result, the robot system design becomes more complex, an external part-specific flip station may be needed, and the robot cycle time and overall system cost increases. Further, because such vibration, etc. provides random, uncontrollable orientation of parts, the parts may be recirculated through the selection zone many times before achieving the desired orientation. Such recirculation may cause undesirable wear on the parts.

There is, accordingly, a need for a flexible, general-purpose compact parts feeder that can handle a large variety of parts without requiring mechanical adjustments or physical alterations to the parts feeder and which presents parts in the desired (final or close to final) assembly or place orientation to avoid or minimize costly subsequent part manipulations performed by the robot, its gripper or external devices. There is also a need for a parts feeder which reduces or eliminates undeterministic and uncontrollable recirculation to avoid parts wear. There is a further need for a parts feeder that reduces cycle time fluctuation.

There is also a need for a parts feeder that can automatically find or optimize its own part-feeding control strategy, and whose throughput can be predicted and whose control and design parameters can be derived from a computer-aided design model of the part by means of computer simulation and the derived parameters can then be downloaded to the feeder in order to expedite programming and deployment. Similarly, the same simulation techniques can be used to suggest part design changes at an early design stage in order to improve parts feeding behavior.

There is a further need for a parts feeder that avoids jamming problems associated with sliding movement of parts along surfaces, and that can convey parts at a variable speed to present a larger or smaller number of parts, as needed. There is also a need for a simple and easily constructed parts feeder that is compact in size, cost-effective, efficient and readily installed in existing assembly and material handling work cells.

SUMMARY OF THE INVENTION

To overcome these and other disadvantages of the prior art, one embodiment of a parts feeder constructed in accordance with the invention includes a framed, flexible planar support onto which parts are dispensed, and which defines a selection/transformation zone in which parts are detected by a machine vision system. The positional states of parts are individually or collectively changed by a transformer to reorient and/or redistribute parts so as to present parts in the desired orientations and locations to a robot for selection. The transformer applies impulsed energy to selective locations on the support, based on the positional states of the parts detected by the machine vision system.

In another aspect, the parts feeder includes a controller for operating the transformer in a plurality of modes, including a first mode for applying impulse energy to the support based on the detected orientation of at least one part by the sensor. The controller may also operate the transformer in another mode for applying impulse energy to the support at a predetermined frequency while moving the transformer relative to the support.

In yet another aspect, the invention includes a method for controlling the positional state of parts in a selection zone by supporting the parts in the selection zone with a flexible membrane, detecting the positional state of at least one part in the selection zone, and selectively applying impulse energy to the membrane, based on the detected positional state of the at least one part, to change the positional state of the at least one part to a predetermined selection state.

These and other features and advantages of the invention are described in or apparent from the following detailed description of preferred embodiments.

BRIEF DESCRIPTION OF THE DRAWINGS

The preferred embodiments are described with reference to the drawings, in which like reference numerals denote like elements throughout the figures, and in which.

DETAILED DESCRIPTION OF PREFERRED EMBODIMENTS

As used herein, the term "parts" refers generally to any discrete objects that are to be fed to a selection zone. Parts include, without limitation, small mechanical, medical, pharmaceutical, electrical and electronic parts used in manufacturing and assembly operations; food and other parts; and partially or fully assembled devices or products.

Figure 1:
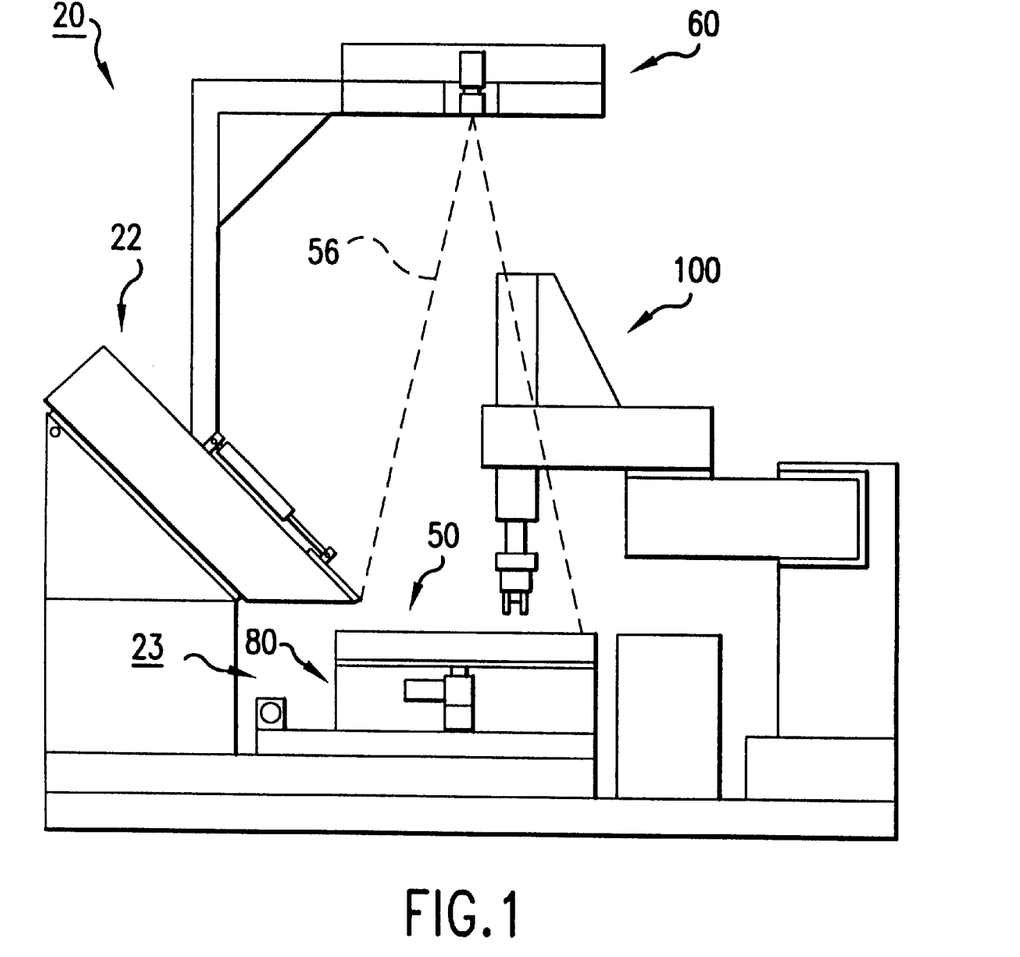
FIG. 1 is a side view of an embodiment of a part feeding system according to the invention.

FIG. 1 depicts an embodiment of a part feeding system 20 constructed in accordance with the present invention. Part feeding system 20 includes a parts dispenser 22 for supplying parts to a transformation unit 23 comprising a support 50 and a transformer 80. Support 50 provides a framed, substantially planar pick-up surface defining a transformation/selection zone where at least one positional parameter defining the positional state of parts is detected and analyzed by a machine vision system 60 including an image sensor 61. As used herein, the "positional state" of a part includes both its location relative to the transformation zone and relative to other parts in the transformation zone, and also its pose (i.e., the position and orientation of the part's coordinate system relative to the feeder coordinate system or relative to a robot selector coordinate system.

Transformer 80 directs impulse energy to support 50 responsive to the machine vision system output to change the positional state of parts determined to be in an undesired positional state so as to redistribute and/or reorient the selected parts to a desired selection state. Parts in the desired selection state are then gripped and removed from the support by a robot 100.

Parts dispenser 22 has a container adapted to receive and contain a volume of parts for subsequent delivery to support 50. The capacity of parts dispenser 22 is selected to achieve the desired autonomous run-time between replenishing. Replenishing may be performed manually or automatically by an optional high-capacity bulk part bin (not shown). A sensor (not shown) signals the need for replenishing if the remaining amount of parts has dropped below a preset limit.

Figure 2:
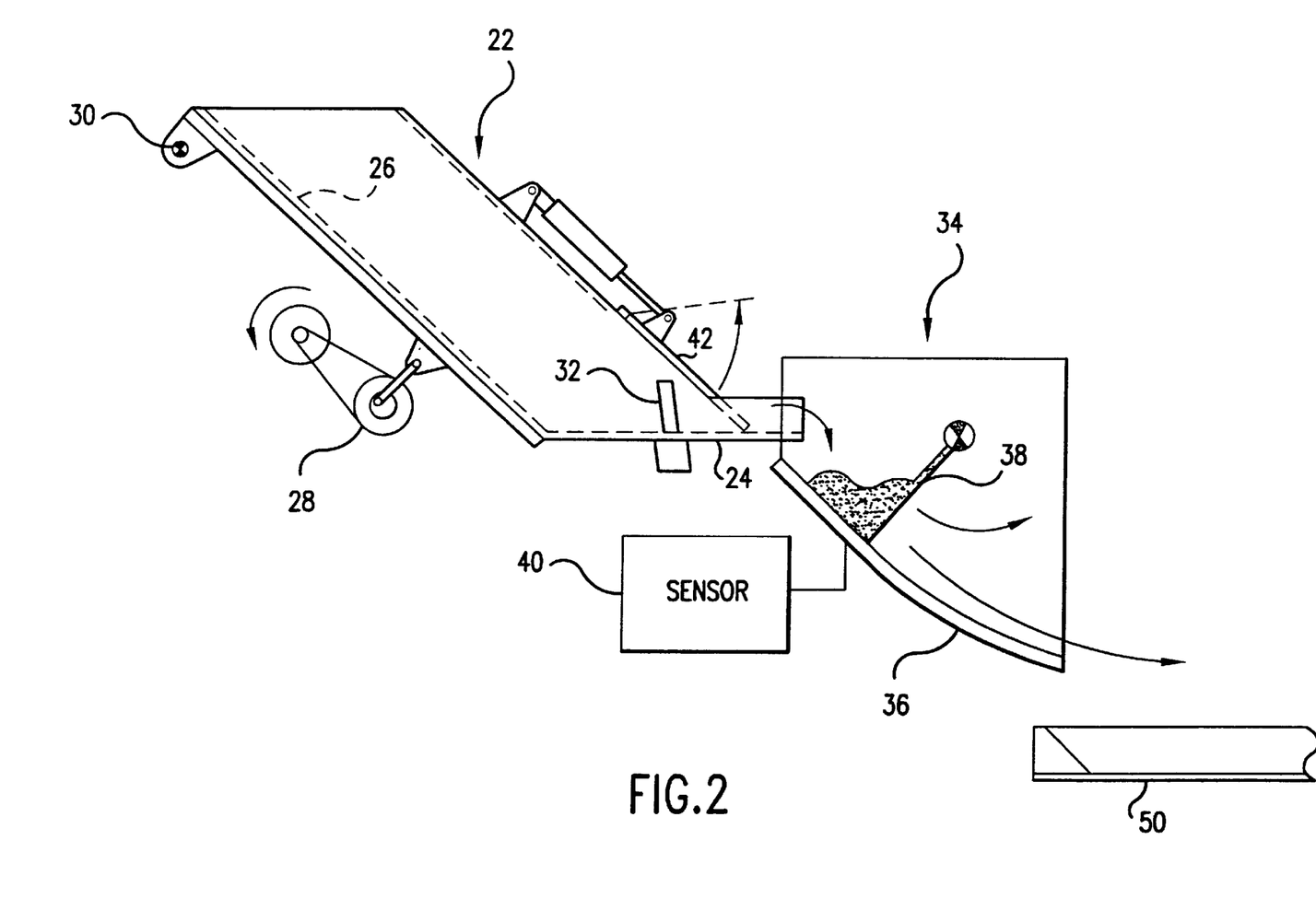
FIG. 2 is a side view of a parts dispenser for the part feeding system shown in FIG. 1.

Parts dispenser 22 advantageously is constructed as disclosed in commonly-owned copending U.S. application Ser. No. 08/939,551, filed Sep. 29, 1997, which is incorporated herein by reference. As shown in FIG. 2, parts dispenser 22 includes a substantially horizontal discharge section or end 24 and an inclined inlet section or end 26. As parts enter parts dispenser 22, they tumble down inlet section 26 toward discharge section 24.

An oscillator 28, which may be a motor/linkage or belt assembly or other device, oscillates parts dispenser 22 about a pivot point 30. As a result, parts dispenser 22 is vibrated, which assists in separating and untangling clumps of parts that may form. Oscillator 28 may be attached to inclined section 26 or discharge section 24. The amplitude and frequency of the oscillation may be controlled by a controller (not shown). For example, an amplitude of 0.7 inches and a frequency of 2 Hz have proven to be advantageous when feeding tangled parts.

To further facilitate separation of clumped or tangled parts, parts dispenser 22 may include an upwardly extending gate or lip 32 that is substantially perpendicular to discharge section 24. As clumped or tangled parts move towards lip 32, they are tossed into the air and fall onto lip 32. At least the parts that bounce on the dispenser surface on the downstream side of lip 32 separate from the larger mass of parts retained behind lip 32. The height of lip 32 may be manually or automatically adjustable as desired depending, for example, on the type of parts, variations in part-to-part and part-to-bin friction (e.g., "sticky" parts like silicon rubber parts have a greater tendency to clump together), or the amplitude and frequency of oscillation. For example, a lip height of 0.6 inches has proven advantageous when feeding medium sized (e.g., 0.75 inch maximum dimension) plastic parts and oscillating parts dispenser with an amplitude of 0.7 inches and a frequency of 2 Hz. Lip 32 may also be fully retracted if the parts used are not prone to clumping.

Parts dispenser 22 may include an optional metering device 34 that supplies a predetermined volume of parts to support 50. Metering device 34 provides a predetermined quantity of parts in close proximity to support 50, in order to increase throughput and to avoid overpopulation/starvation of the support surface.

Metering device 34 includes an inclined or curved track 36 that receives parts from discharge end 24 and directs the parts towards support 50. Thus, track 36 defines a path between discharge end 24 and support 50. A pivotal gate 38 collects and retains parts on track 36 as they exit discharge end 24 and controls the movement of parts from track 36 onto support 50.

A sensor 40 detects the amount of parts held on track 36 behind gate 38. Sensor 40 may be a weight sensor for detecting the weight of the parts held by track 36, a level sensor for detecting the height of the parts accumulated by gate 38, or any other known sensor for detecting the volume or quantity of parts.

Parts dispenser 22 and/or metering device 34 are responsive to a control signal that is based on the machine vision system output, so that the dispensing of parts is controlled to optimize the number of parts on support 50 for recognition by the machine vision system.

In order to dispense parts, gate 38 is pivoted counterclockwise from its closed position to allow the parts held behind gate 38 to flow onto support 50. Alternatively, a latch (not shown) that is responsive to the control signal based on the machine vision system output may be used to retain gate 38 in its closed position. When the latch is released, the gate is either actively driven or forced by the weight of the parts to an open position. When the feeder control system determines, based on the machine vision system output, that a sufficient number of parts have been dispensed onto the support, gate 38 is then swung back to its closed position.

To prevent parts from accidentally exiting parts dispenser 22 during operation of metering device 34, parts dispenser 22 may also include an optional gate 42 to enclose discharge end 24. Sensor 40 may selectively control the opening and closing of gate 42 in coordination with gate 38. For example, sensor 40 may control gate 42 so that it remains open until the predetermined quantity of parts have been collected on track 36. Sensor 40 then closes gate 42 and opens gate 38 to feed parts onto support 50. Once gate 38 swings back to its closed position, sensor 40 directs gate 38 to reopen so that another quantity of parts is supplied to track 36.

Figure 3:
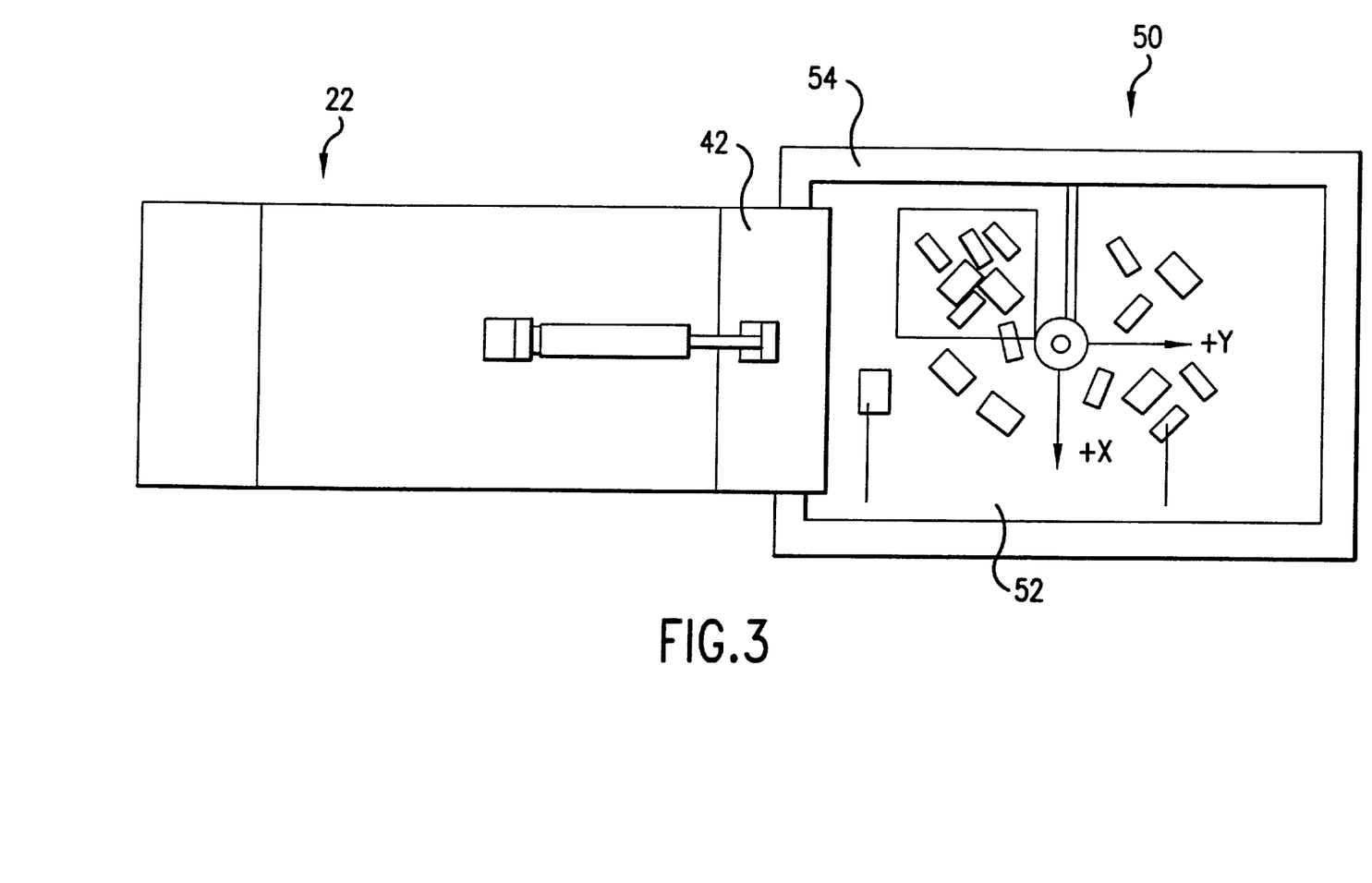
FIG. 3 is a top view of the parts dispenser shown in FIG. 2 and a support for the part feeding system shown in FIG. 1.

As shown in FIG. 3, support 50 includes a framed, planar, flexible surface. Advantageously, the surface is provided by a tensioned flexible membrane 52 supported by framing side walls 54 that extend above and surround the surface of the membrane. To tension the membrane 52, clamps (not shown) may be secured to side walls 54 or to a further outer frame (not shown) for gripping the edges of the flexible membrane. The clamps advantageously are mounted to side walls 54/the outer frame by screws so that the tension of the membrane 52 may be easily adjusted by rotating the screws to pull the clamps outwardly, thereby stretching the membrane. The clamps may also be configured such that they themselves define an upstanding frame around membrane 52.

Alternatively, side walls 54 or other framing members may have a plurality of mounting pins (not shown) that engage corresponding holes (not shown) formed around the periphery of the membrane 52. The area of the membrane 52 hole pattern is sized relative to the area defined by the mounting pin pattern so that the membrane must be stretched to align the holes with the pins. This mounting arrangement permits different membranes to be easily interchanged in the feeding system, and ensures that substantially the same tension is applied to membranes of the same type without the need to adjust any mounting clamps. (The tension applied to different types of membranes can be varied by adjusting the relative size of membrane and/or the location of the mounting holes relative to the peripheral edge of the membrane.)

Suitable membrane materials include polyurethane, with or without a fabric material embedded therein, or other materials typically used in industrial conveyor belts. The thickness of the membrane material is typically about 1 mm., although the thickness may vary depending, for example, on the texture of the membrane material, as discussed below.

The flexible membrane 52 may also have a dual layer configuration, with a tensioned bottom layer and a top layer resting on the bottom layer (not shown). Preferably, the top layer is secured to side walls 54 or other framing members without being placed in tension. Because the top layer is not placed in tension, it facilitates damping of the vibration generated in the membrane when impulse energy is applied by the impulse generator, as discussed below in more detail. A dual layer membrane made with polyurethane having no embedded fabric has approximately the same damping characteristics as a single layer membrane made with polyurethane having embedded fabric. However, the dual layer configuration allows the user to easily vary the texture and/or color of the membrane material by simply replacing only the top layer instead of the entire membrane configuration.

The surface area of membrane 52 defines a selection/transformation zone (also shown by dashed lines 56 in FIG. 1) in which parts received from dispenser 22 are analyzed by machine vision system 60 and their orientation selectively transformed, if necessary, based on the analysis. So machine vision system 60 can reliably recognize parts in the transformation zone, a good and constant contrast between background (the top surface or layer of the membrane) and parts should be established. A set of precut membranes or membrane top layers in different colors can be used to optimize the contrast, with or without top-lighting. Also, to reduce the settling time of, for example, cylindrical parts, textured top surfaces or layers may be used. Such a textured membrane material preferably has a random, asymmetrical geometric pattern to prevent rolling of parts on the surface.

The size of the transformation zone (the effective active area of membrane 52) can vary. The minimum practical size is an area sufficient to allow a single part to rest on the membrane surface in any of its stable poses, and to allow the desired transformations to be performed on the part. Increasing the size of the transformation zone to accommodate plural parts is advantageous because it permits shorter and more uniform cycle times. (With many parts in the transformation zone, there is a statistically greater probability that at least one of the parts will be in the desired pose.) Practical upper limits on the size of the transformation zone are the resolution and effective imaging area of machine vision system 60, and the size of the work envelope of the robot selector 100.

Figure 4A:
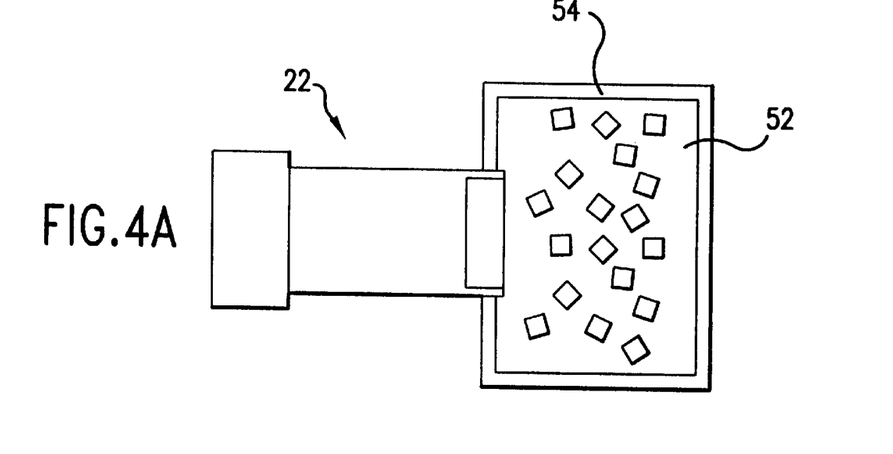
FIGS. 4A–4C are top diagrammatic views of alternative transformation zones for use with the parts feeder of the invention.
Figure 4B:
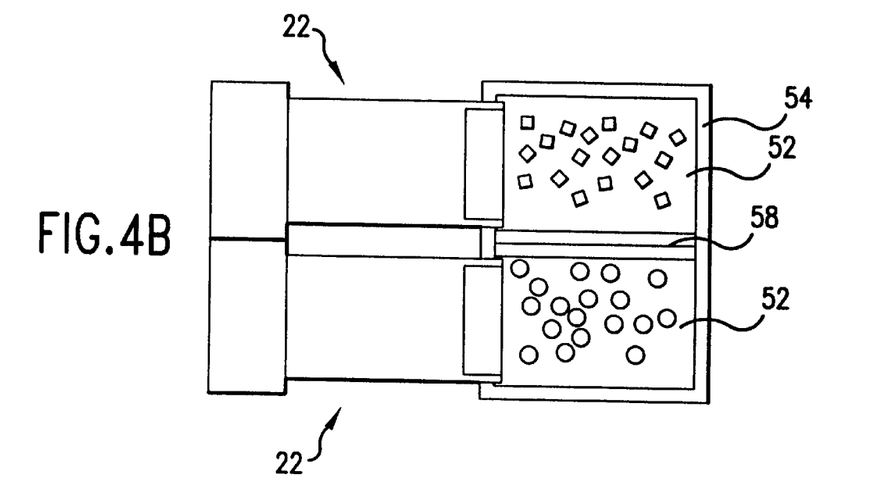
Figure 4C:
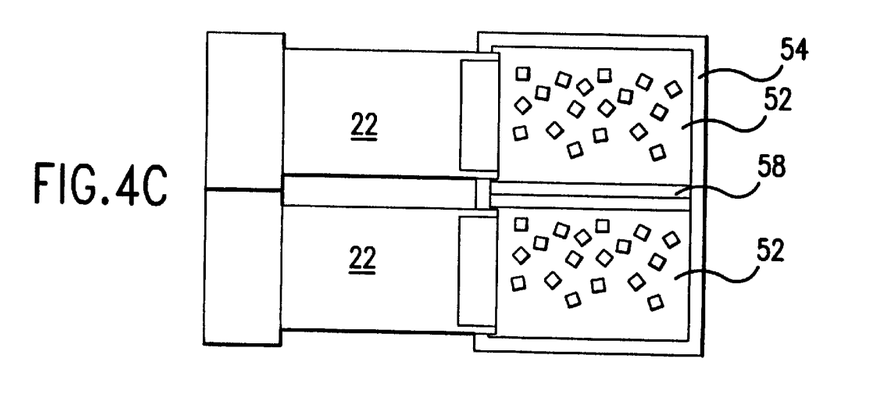

A large transformation zone (FIG. 4A) can be divided into accordingly smaller transformation zones (FIGS. 4B and 4C) by adding one or more dividers 58. Since the resolution of sensor 60 may not be sufficient to recognize subtle features that distinguish the different part poses, additional sensors, as well as additional dispensers, may be needed. However, the same basic feeder infrastructure can be shared to feed N multiple different parts (N=2 in FIG. 4B), reducing dramatically the cost per part fed, almost by a factor of N. With such a setup, not only can N different parts be fed, but also two or more parts of the same kind (FIG. 4C) may be fed to different transformation zones in order to improve cycle time. In addition, the large (undivided) transformation zone can be used to handle larger parts. Usually, when dispenser 22 introduces additional parts to the transformation zone, a short increase in cycle time is observed. Having physically separated transformation zones with independent dispensers allows robot 100 to switch between the two or more transformation zones to select parts and hence reduce the delay.

Machine vision system 60 preferably is configured as disclosed in the aforementioned U.S. Pat. No. 4,876,728 to Roth incorporated herein by reference so as to detect the location, number, and orientation of parts on support 50. Other sensors, such as three-dimensional scanners, may also be used.

The output of machine vision system 60 preferably is used in the control of various aspects of the feeding system operation to facilitate the selection and transformation of the parts. For example, as discussed above, the machine vision system output may be used to control dispenser 22 to maintain the optimum number of parts in the transformation zone. Machine vision system 60 preferably is configured to detect whether parts are clumped or tangled on support 50, and transformer 80 is controlled responsive to such detection to separate the clumped or tangled parts. Machine vision system 60 is also configured in accordance with the invention to detect the orientation of parts on support 50 and to compare the detected orientations with a predetermined part orientation, which typically corresponds to the desired orientation of the part for pick-up by robot 100. The output of machine vision system 60 is used to control transformer 80 so that transformer 80 may reorient the part to the desired orientation. Finally, machine vision system 60 preferably provides feedback for controlling robot 100 to remove parts on support 50 having the desired orientation.

Robot 100 can either be a Cartesian-coordinate robot, a vertically articulated robot, or a horizontally articulated robot, such as disclosed, for example, in allowed, copending U.S. patent application Ser. No. 08/428,679, which is commonly assigned and is incorporated herein by reference. The robot may pick up parts with a gripper, as disclosed in application Ser. No. 08/428,679, or a suction nozzle may be used if it is not necessary to grip the exterior of the part. The specific structure of the robot is not critical to the invention, and various other robot configurations may be employed.

Figure 5:
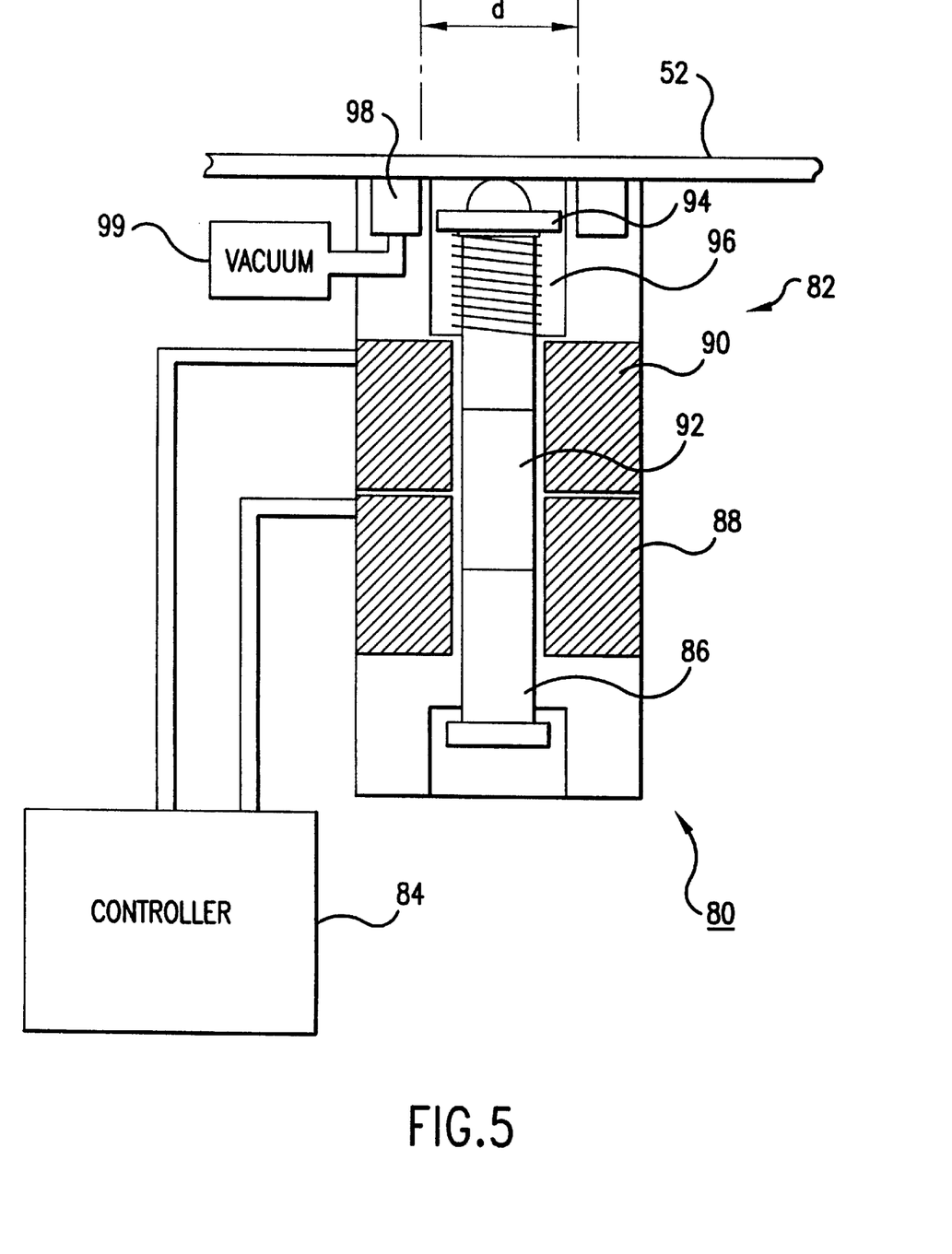
FIG. 5 is ai side cross-sectional view of a transformer for the parts feeder shown in FIG. 1.

As shown in FIG. 5, transformer 80 includes one or more impulse generators 82 and a controller 84 for positioning the impulse generators and directing them to apply impulsed energy to support 50 based on the analysis by machine vision system 60. Impulse generator(s) 82 tap(s) on membrane 52 from underneath in order to reorient and redistribute parts in the transformation zone. The energy and frequency of the impulses applied to the membrane are programmable.

Figure 7A:
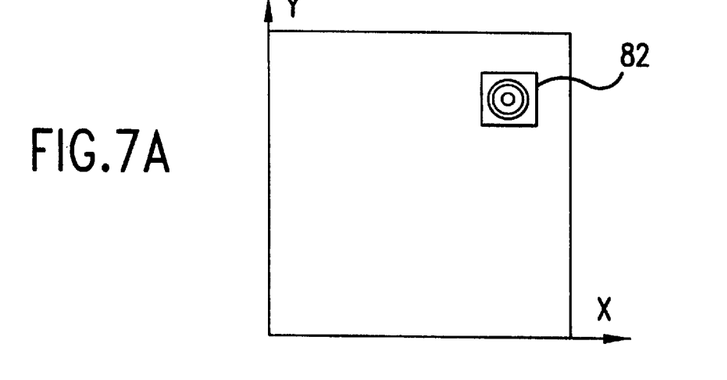
FIGS. 7A–7C are top diagrammatic views of embodiments of a transformer for use with the parts feeder of the invention.
Figure 7B:
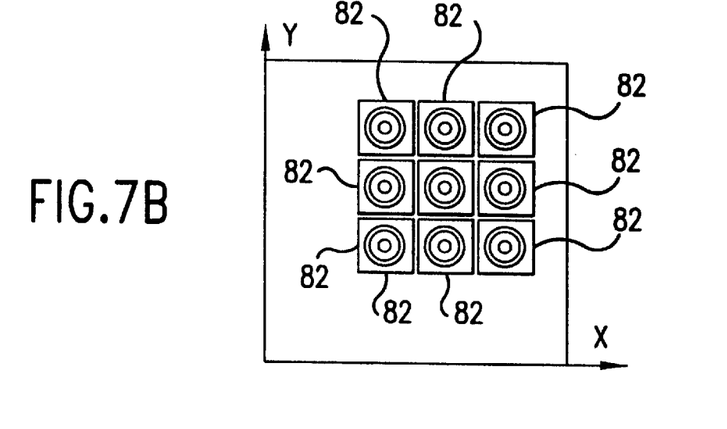
Figure 7C:
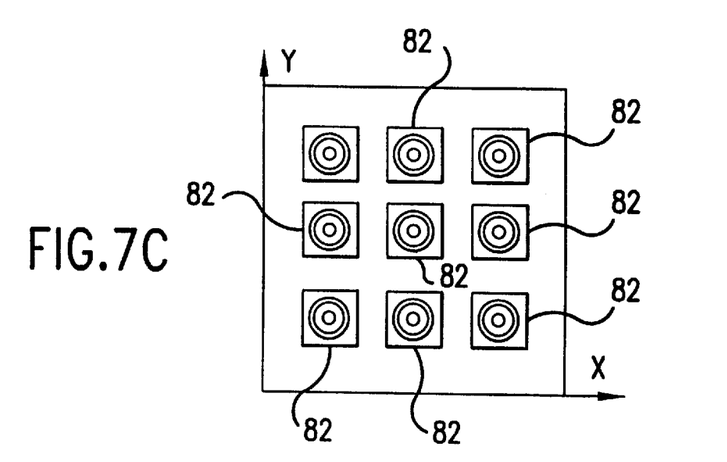

There are several solutions for reorienting and scattering all the parts in the transformation zone according to different user needs. The most flexible approach is to utilize a single impulse generator (FIG. 7A) that is movable relative to membrane 52 in a plane parallel to membrane 52. To improve throughput and maintain the flexibility of a single impulse generator, an array of impulse generators (FIG. 7B) can be moved relative to membrane 52 in order to minimize the average distance the impulse generators must be moved in order for one of the impulse generators to reach a desired part, as well as in the random transformation mode. All or a selected group of impulse generators can be run simultaneously in order to scatter parts faster. A third alternative is to have an array of stationary impulse generators (FIG. 7C), and operate the feeding system exclusively in a random transformation mode (described below), and respectively sequence the impulse generators (e.g., by a phase shift between coil actuation) to move groups of parts in a desired direction or resolve regions cluttered with parts. Machine vision system 60 constantly analyses t-he transformation zone, providing feedback about regions cluttered with parts, as well as part poses, locations and orientations of identified parts in order to control the impulse generators.

One embodiment of impulse generator 82 includes an electrical coil and plunger arrangement that can generate a single impulse or multiple impulses of programmable frequency and energy. As shown in FIG. 5, this embodiment of impulse generator 82 includes a plunger 86 movably supported within a passageway surrounded by magnetic coils 88, 90. Plunger 86 includes a magnetic core 92 that is responsive to coils 88, 90. As a result, plunger 86 is moved in a vertical direction to tap onto membrane 52 by selectively energizing coils 88, 90 with controller 84. A hammer 94 disposed at the end of plunger taps onto membrane 52, inducing a wave that travels through the entire membrane 52 with hammer 94 in its epicenter. A spring 96 supports plunger 86 in the passageway between coils 88, 90 when coils 88, 90 are not being energized. Hammer 94 has a hemispherical end as shown in FIG. 5, although conical, frusto-conical, cylindrical, and other shapes may be used.

The shape of the hammer depends on various factors, including the type and the geometry of the parts; whether the part generally makes point, line or area contact with the membrane; the precision with which the impulse energy is to be applied to the membrane; and the degree of wear on the membrane that is acceptable. Pointed (e.g., conical) hammer shapes are preferred where the impulse energy must be applied to the membrane at a precise location. Such precision is typically required here the parts have flat surfaces. However, a pointed ammer wears on the membrane more rapidly than a hammer having a blunt end. Where precision is not critical or where there is uncertainty where to apply impulse energy to the membrane, blunt-shaped (e.g., hemispherical) hammers may be used. Such blunt shapes are typically used where the parts have thin edges or other fine features. Rigid materials, such as aluminum and steel, are preferably used for the hammer.

Figure 6:
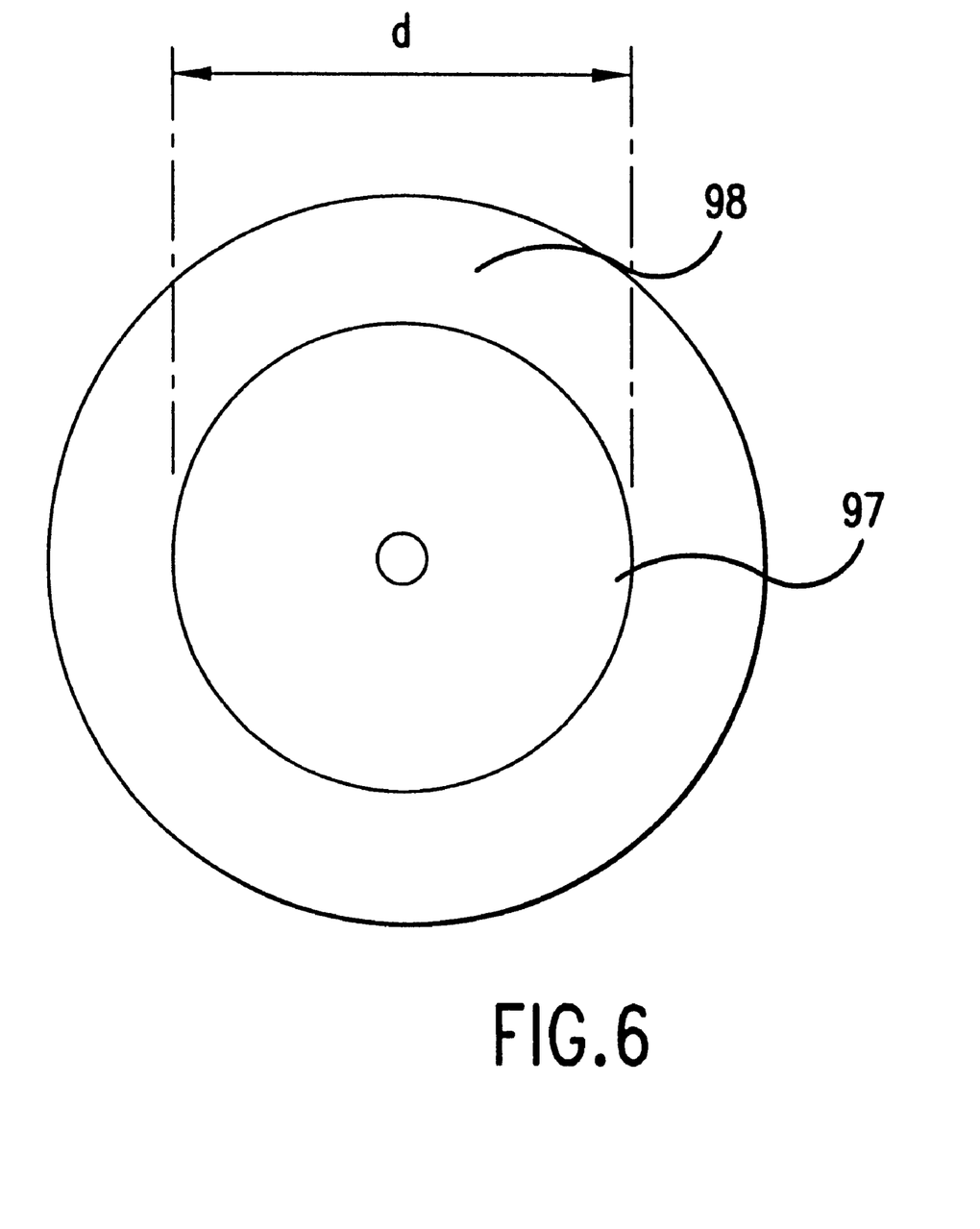
FIG. 6 is a diagram of a vacuum zone for use with the transformer shown in FIG. 5.

To localize the impact of the hammer (i.e., how far the impulse wave travels and disturbs parts), a ring-shaped vacuum zone 98 concentrically arranged around each hammer 94 and connected to a vacuum source 99 can be optionally applied to membrane 52 from underneath. As a result, the wave energy can only be felt within the circular area 97 (FIG. 6), having a diameter d, of the ring-shaped vacuum zone 98. This setup allows the transformer to operate in two distinctive modes, which are described further below.

The impulse energy that is transferred to the part is used to reorient the part to another pose. Depending on where, relative to the part, the impulse is induced and the energy magnitude of the pulse, the part is tossed into the air and spun around. The offset measured relative to the part's center of gravity and orientation and the amount of energy applied, are used to control how far the part moves up in the air and about what axis and how fast it spins around.

In general, a part can be transformed from its current pose to a desired pose by applying an impulse of the right energy and at the right position relative to the part's center of gravity and orientation. For example, a Delco internal pushbutton part is similar to a cube and has eight stable states. When resting on a 1 mm-90 shore thick polyurethane membrane constrained by a 20 mm diameter vacuum ring, this part may be reoriented to a face-up orientation by applying a single impulse of energy having a magnitude of 3 mJ delivered to the part, at a point 4 mm from the part's center of gravity and its major axis.

Practical limitations exist in the sense that transforming a part from a high probability stable state to a very low probability stable state will not lead to a practically useful transformation success rate. For example, a coin can be easily flipped from head to tail and vice versa. Trying to transform it from either side to its edge, will lead to a very low success rate. Various factors, such as the residual kinetic energy caused by minute impulse and offset fluctuations, may affect the transformation.

The shape of the hammer tip, the membrane material and thickness, and the lateral tension applied to the membrane preferably are selected in combination to optimize the energy transfer from the hammer through the membrane to the part. For example, a rounded or hemispherical hammer shape in combination with a polyurethane membrane tensioned by applying 5 lb.-in of torque to M6 screws with 1 mm pitch supporting the membrane clamps, and having a thickness of 1 mm has been shown to be advantageous when handling light parts.

The preferred operating modes will now be described with respect to a single impulse generator mounted on a programmable xy-positioning mechanism. The following explanations also apply in full to a transformer with an array of impulse generators mounted on a programmable xy-positioning mechanism. A stationary array of impulse generators can only usefully be operated in the first mode described below. The operating modes listed below can be used individually or in combination to achieve a desired behavior of parts in the transformation zone and implement various parts feeding strategies:

a) Parts can be scattered and spread out randomly

Figure 8A:
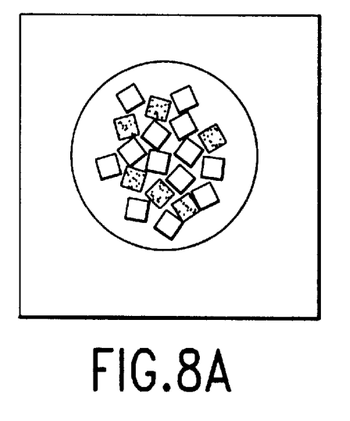
FIGS. 8A–8J are top diagrammatic views showing movement of parts with a transformer for use with the parts feeder of the invention.
Figure 8B:
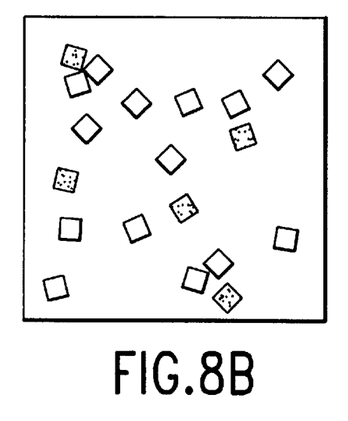

With vacuum turned off, impulse generator(s) 82 tap(s) onto membrane 52 at a predetermined frequency of, for example, 2–25 Hz. Simultaneously, impulse generator 82 is moved on a user-definable, random, or machine vision-guided path to resolve cluttered regions and redistribute (spread out) and reorient parts in the transformation zone. In some situations, parts supplied in bulk, such as springs, sheet metal or complex plastic parts, tend to tangle. Prior to picking by robot 100, these parts must be detangled. This mode facilitates detangling and unclumping parts. FIGS. 8A and 8B show the positioning of clumped parts on a support before (FIG. 8A) and after (FIG. 8B) operation in this "random" transformation mode.

The impact of hammer 94 at an arbitrary position of membrane 52 generates a wave that travels through membrane 52 and causes parts near the epicenter to scatter, reorient randomly, and detangle. The energy and frequency of the impacts is programmable and can be used to achieve the desired results for a variety of parts with respect to part weight, size, shape, material, and tangling.

The random transformation mode is typically used when machine vision system 60 can not identify isolated parts that can be picked by robot 100 or individually transformed to the desired pose, or further detangling is needed.

b) Aimed transformation of singulated parts to desired stable states

In an aimed transformation mode, isolated (separated) individual parts with known orientations and locations as detected by machine vision system 60 are individually transformed with well-aimed impulses of preset energy to the desired stable states. With vacuum turned on, impulse generator 82 is moved to a predetermined position relative to the location of the part to be reoriented, and a single impulse of preset energy is applied to transform the selected part from its current to an intermediate or final/desired stable state. In general, the predetermined position is near a contact point of the part and membrane. The preset energy is based on a comparison between the desired orientation of the part, which is stored in the machine vision/feeder controller memory, and the orientation detected by machine vision system 60. Both the predetermined position and the preset energies may either be computed or taught, as described more fully below. Machine vision system 60 is used to identify isolated parts that have enough space around them so that the transformed part can land safely. The vacuum restricts the effect of the impact to the selected part.

Figure 8C:
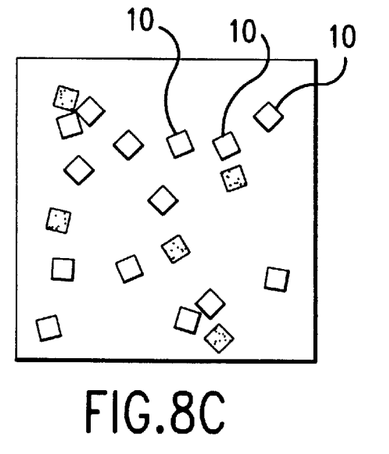
Figure 8D:
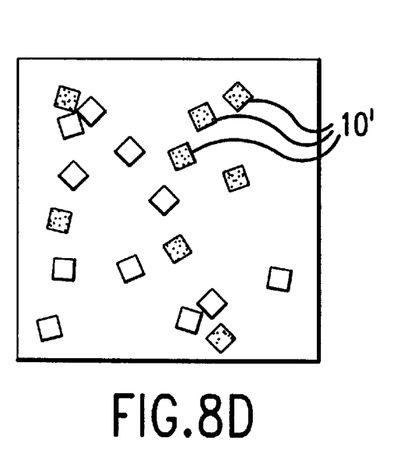

For example, parts 10 shown in FIG. 8C are each individually reoriented to the desired orientations 10' (FIG. 8D) by one or more impulses of energy. Those parts shown as solid black squares are parts having the desired orientation, and squares shown in white are parts not having the desired orientation.

c) A group of parts can be marched in a desired direction

Figure 8E:
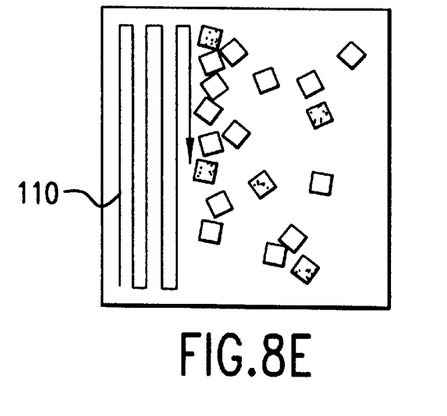
Figure 8F:
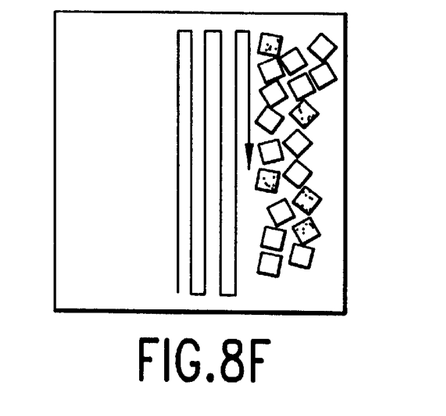

If impulse generator 82 is moved along a fine-pitched zig-zag path 110, as shown in FIGS. 8E and 8F, operating at a high frequency (e.g., 15–20 Hz), parts in front and orthogonal to the zig-zag path can be moved in the desired direction, as shown in FIG. 8F. Machine vision system 60 can be used to control this "marching" of parts. For example, should individual parts or groups of parts deviate from the desired marching direction, impulse generator 82 can bring those parts back on the desired path. The applied impulse energy preferably is controlled so that parts are translated, but not reoriented. This is achieved by using relatively low magnitude, high frequency impulses.

Figure 8G:
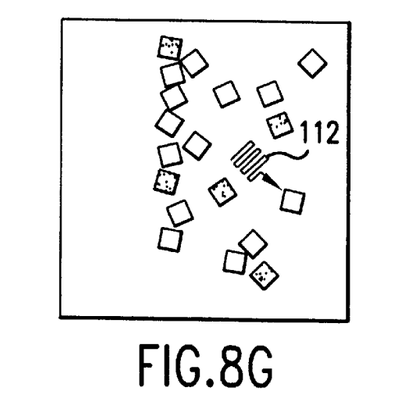
Figure 8H:
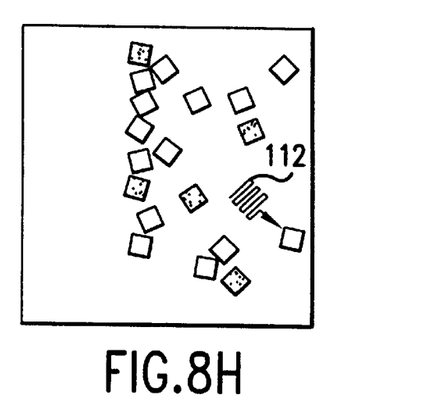

This method may also be applied to a single, isolated part, as shown in FIGS. 8G and 8H, by moving impulse generator 82 along a more limited path 112. This method may also be used to selectively "march" defective parts, dirt, and other extraneous items (as detected by the machine vision system) to a corner of the membrane, where the undesired items can be removed without interfering with the operation of the main robot part handling device. For example, a gate in the side walls (not shown) may be opened to remove such items from the membrane. An alternative method for clearing the membrane of parts that is much faster, but is not selective in what parts are removed, is to make membrane 52 and the xy-positioning mechanism for the impulse generator(s) pivotable together so that the transformation zone can be tilted to an inclined state, e.g., 5 degrees. A gate can be opened on the "downhill" side of the transformation zone to let parts escape while the impulse generator is activated to vibrate membrane 52.

d) A pair of touching parts can be separated

Figure 8I:
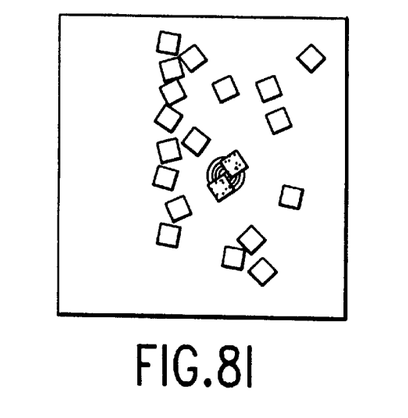
Figure 8J:
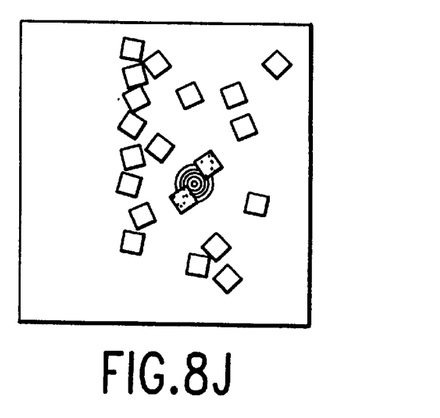

Tapping on the center between two parts (FIG. 8I) separates touching parts (FIG. 8J). Machine vision system 60 again is used to repeatedly update the center's x and y coordinates so that the tap position of the impulse generator is adjusted accordingly. This mode is not critical when using a robot with a suction nozzle and a machine vision system that can distinguish among touching parts.

There are at least two methods for determining the impulse application points and corresponding magnitudes to transform a part from one pose to another: (a) a theoretically-based method; and (b) an experimentally-based method. In the former method, the optimum tap-points and estimated energies to transform a part from each pose to another may be computed from a computer-aided design (CAD) model of the part, incorporating characteristics of the feeder setup, such as hammer shape, membrane material characteristics, exact parameters for the surface tension, and material properties. Based on these parameters and using dynamic equations of motion, the part's motion can be determined as long as external disturbances, such as touching parts and air flow in the room, are negligible.

The experimentally-based method is based on tapping the part at different locations with different energies and observing the changes in the part's stable state, as detected by the machine vision system. The part is tapped at different points starting with very low energies until a change of state occurs. To start the process, a single part is placed on membrane 52 and machine vision system 60 determines the pose and location of the part. Given the determined pose, the initially computed/estimated control parameters are used to tap the part at an initial location near the correct point. Machine vision system 60 monitors the part while impulse generator 82 is controlled to slowly increase the energy from a level clearly below the initial determined value until machine vision system 60 signals a pose transition. The procedure is repeated several times. If the expected or desired success rate is not achieved, tap-points and energy levels are systematically varied to find an optimum set of parameters.

The experimental tap points preferably are not totally random or based on an exhaustive grid search. Rather, they are based on the basic rules that govern the dynamics of the process. For example, the impulse generator advantageously is initially positioned to the right of the axis of rotation of the part to be reoriented, and a low level of energy is applied to see if the part's stable stated is changed. If not, the impulse generator is moved farther to the right of the part and the same level of energy is applied. This process is repeated until a change in stable state is detected and stored by the machine vision system.

A neural network "trained" by the machine vision system may be used to implement this experimentally-based method. In addition, the machine vision system can be first trained to recognize the stable states of a part by performing a preliminary training operation in which the user successively positions the part on the membrane in each of its various stable states, and instructs the vision system to recognize each stable state. Alternatively, the machine vision system can be configured to learn a part's stable states at the same time the appropriate tap points and impulse energies are being learned for each stable state, by allowing the training process to continue for a time statistically-determined to be sufficient for the part to be transformed to, and recognized by the machine vision system as being in, each of its stable states.

Once parts have been dispensed into the transformation zone, the user has the option to repetitively scatter and selectively transform the parts until all parts have been removed by robot 100. By transforming individual parts, a certain number of parts dispensed into the transformation zone can be picked and removed by robot 100 in a predictable time with a minimum of wear on the parts.

An exemplary operation of the parts feeder of the present invention is described next. The description assumes that initially the transformation zone is empty and dispenser 22 is loaded with parts. In this situation, dispenser 22 first dispenses a desired amount of parts into the transformation zone. As discussed above, in one embodiment of the feeding system, machine vision system 60 can monitor the dispensing process and signal dispenser 22 to stop the dispensing process when the machine vision system detects the desired number of parts in the transformation zone. Machine vision system 60 then analyzes the transformation zone for parts having the desired orientation, cluttered regions, and parts that can be transformed to the desired stable state (i.e., singulated, or isolated individual parts). Robot 100 is first controlled to remove all the parts having the desired orientation. While robot 100 places parts, transformer 80 repetitively resolves cluttered areas and transforms isolated parts to the desired stable state.

Also, machine vision system 60 preferably keeps track of both approximately how many parts total are in the transformation zone and how many pickable parts, i.e., singulated parts that are properly oriented, are in the transformation zone. The estimated number of total parts and the software queue of pickable parts in the transformation zone are used together to decide when dispenser 22 needs to be actuated to dispense new parts into the transformation zone. The "software" or virtual queue of pickable parts is equivalent to a physical queue of parts provided in vibratory bowl feeders, and helps greatly to reduce cycle time fluctuations.

If the success rate of transforming a part with a well-aimed impulse to the desired stable state is low, transformer 80 may optionally only be operated in the random transformation mode. Knowing the approximate number of parts in the transformation zone and their stable state distribution, the average number of pickable parts can be estimated. An alternative approach is to use the aimed transformation mode described above, but transform the parts to a "next best" stable state, i.e., a pose with a high probability and suitable for subsequent easy manipulation, and manipulate the part in a secondary operation to the final assembly/place orientation and location. Reorienting a part after pick-up by an angle of less then 90 degrees about the plane of the surface on which the part is resting is a simple robotic operation.

There are two possible strategies for handling the parts reorientation: (a) intermittent reorientation, and (b) continuous reorientation. The former strategy will reorient parts in the transformation zone only after a desired part has been grasped. From the time the robot departs to the time it clears the vision sensor, the transformer can reorient parts as fast as it can. Once the robot clears the vision sensor, it sends a signal to the transformer to halt its operation and sends a message to the vision system to capture and process the next image. Alternatively, the continuous reorientation strategy does not halt the transformer from operating while the robot is picking parts. However, the transformer's work area is limited to avoid disturbing the part that will currently be picked by the robot. A "safe" radius is placed around the selected part, in which no impulses are applied, to ensure the proper pick of that part.

A part feeding system according to the invention may be composed of individual, modular components; or may be composed of functional modules tightly integrated into a compact, single stand-alone system that receives parts in bulk and outputs parts in a desired orientation and location. A modular arrangement advantageously can be used in combination with other traditional types of feeders. For example, a small transformation unit 23 having a transformation zone that can accommodate at least one part can be placed at the outlet of traditional feeders that singulate parts, such as vibratory bowl feeders, to efficiently transform the singulated parts to a desired pick-up pose. An integrated system enables a cost-effective and compact implementation of such a feeding system. The advantage of a fully integrated feeding system built in accordance with the invention lies in its ease-of-use, compactness and rapid installation and set-up. Further, when equipped with a communication interface, such a fully integrated feeding system can be easily integrated into a variety of assembly and material handling cells. In addition, a supplier of such a feeding system can setup and program the system in-house for a particular customer part, and then ship the system as a tested and ready-to-run unit to the customer.

Figure 9:
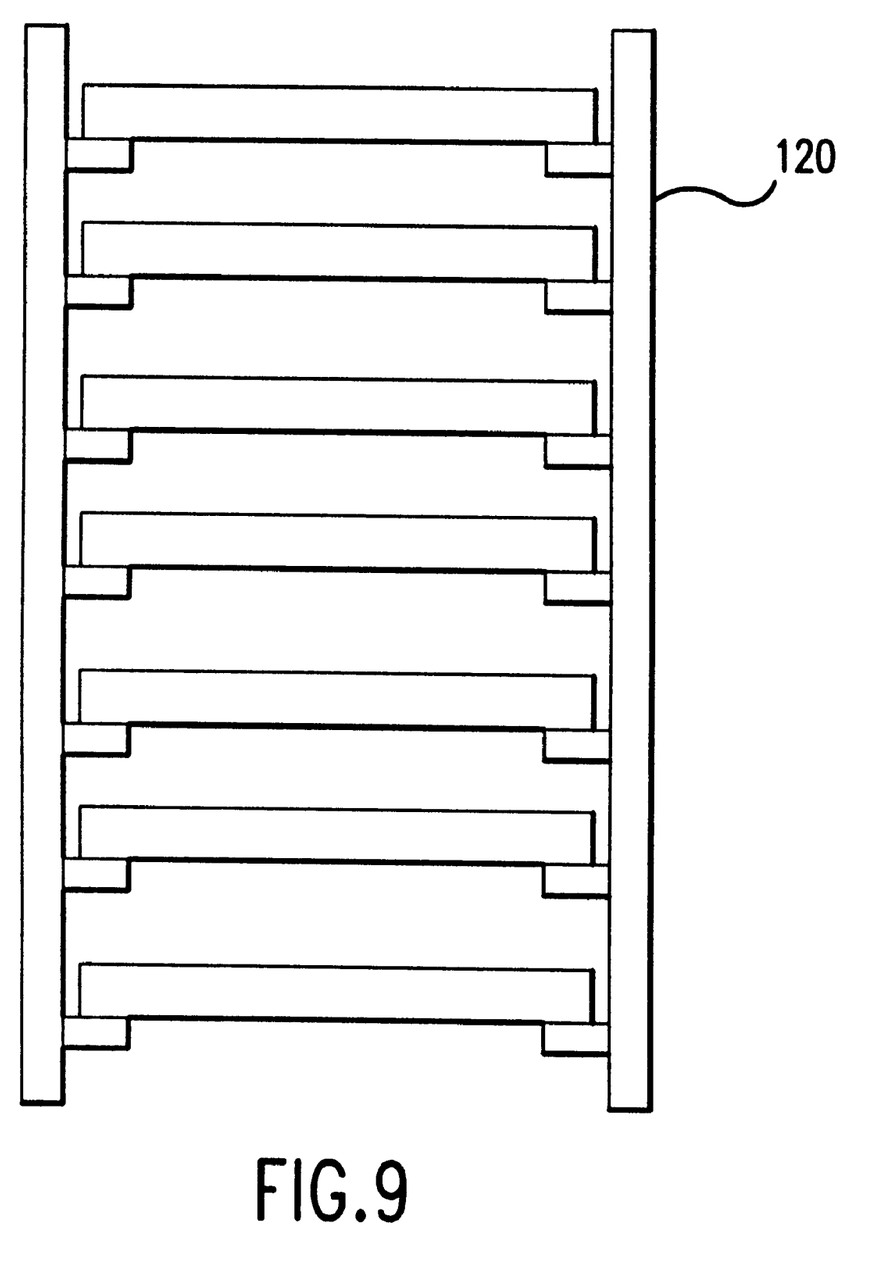
FIG. 9 is a side diagrammatic view of a tray magazine for use with the parts feeder of the invention.

Other parts feeder embodiments are contemplated. For example, a tray magazine 120 as shown in FIG. 9 may be substituted for parts dispenser 22. Tray magazine 120 stores several trays 122, each of which is similar in structure to support 50 shown in FIG. 3. Trays may also be molded from a flexible plastic that acts as a membrane, e.g., with a thin bottom layer and thickened side walls. A selected tray is removably positioned below machine vision system sensor 61 and adjacent parts dispenser 22 like support 50 shown in FIG. 1. A conveying system and/or robot (not shown) removes selected trays from tray magazine 120 and conveys them to the position below sensor 61, after removing empty trays from below sensor 61. Upon request, a tray carrying a desired part is positioned over transformer 80 and underneath sensor 61 and robot 100 can start to pick one or several parts out of the tray. To enable a smooth operation, the tray magazine may hold two or more trays with parts of the same kind, which allows for timely replenishing by the operator. Tray magazine 120 also allows feeding of various parts into the robot's work envelope and still leaves room for other robot peripherals.

While the invention has been described with reference to specific embodiments, the description is illustrative and is; not to be construed as limiting the scope of the invention. Various other modifications and changes may occur to those skilled in the art without departing from the spirit and scope of the invention.

What is claimed is:

1. A parts feeding system, comprising:
   a support having a flexible surface for supporting parts;
   a machine vision system that detects at least one positional parameter defining the positional state of parts on said flexible surface; and
   a transformer responsive to said machine vision system that applies impulse energy to the support flexible surface so as to selectively change the positional state of at least one part on said flexible surface.

2. The system of claim 1, wherein said transformer applies at least one energy impulse of selected magnitude at at least one selected location of said flexible surface responsive to the detected at least one positional parameter to relocate and/or reorient at least one part on said flexible surface.

3. The system of claim 2, wherein said transformer applies at least one of said energy impulses responsive to the detected location and orientation of a detected singulated part to transform the orientation of said singulated part to a desired orientation.

4. The system of claim 1, wherein said transformer is movable relative to said flexible surface.

5. The system of claim 4, further comprising a controller responsive to said machine vision system for moving said transformer relative to said flexible surface.

6. The system of claim 1, wherein said transformer comprises at least one hammer movable into and out of contact with said flexible surface for applying a predetermined level of impulse energy to said flexible surface.

7. The system of claim 6, wherein said transformer comprises an array of plural said hammers.

8. The system of claim 7, wherein said array of hammers is movable in an xy-plane relative to said flexible surface.

9. The system of claim 7, wherein said array of hammers is stationary relative to said flexible surface.

10. The system of claim 1, wherein said transformer further comprises means for localizing the impulse energy applied to said flexible surface by said transformer.

11. The system of claim 7, wherein each of said hammers is independently controllable to selectively apply impulse energy to said flexible surface.

12. The system of claim 6, wherein said transformer further comprises a suction member controllable to apply a vacuum zone to said flexible surface around said at least one hammer so as to localize the impulse energy applied by said transformer to said flexible surface.

13. The system of claim 1, wherein said machine vision system compares the detected orientation of a selected part with a predetermined orientation, and said transformer applies an energy impulse to said flexible surface based on the energy required to reorient the selected part from the detected orientation to the predetermined orientation.

14. The system of claim 1, wherein said machine vision system detects the relationship of parts relative to each other on said flexible surface, and said transformer applies at least one energy impulse to said flexible surface responsive to said detected parts relationship so as to separate tangled or clustered parts.

15. The system of claim 1, wherein a framed, substantially planar, tensioned, flexible membrane provides said flexible surface.

16. The system of claim 15, wherein the membrane has a textured surface.

17. The system of claim 16, wherein the textured surface has an asymmetrical pattern.

18. The system of claim 15, wherein the membrane comprises a tensioned bottom layer and an untensioned top layer on the bottom layer.

19. The system of claim 1, wherein said flexible surface comprises a plurality of different selection zones, each selection zone being sensed separately by said machine vision system.

20. The system of claim 15, wherein said support comprises a table and a tray providing said flexible membrane, said tray being removably mounted to said table.

21. The system of claim 20, further comprising a tray magazine for containing a plurality of said trays, said tray magazine supplying selected trays to said support table and receiving trays removed from said support table.

22. The system of claim 1, further comprising a parts dispenser for supplying parts to said support.

23. The system of claim 22, wherein said parts dispenser is controlled responsive to said machine vision system so as to supply a predetermined number of parts to said support.

24. The system of claim 23, wherein said parts dispenser is controlled to resupply said support in dependence on the total number of parts and/or the number of parts in a predetermined state sensed by said machine vision system.

25. The system of claim 24, wherein said predetermined state corresponds to a singulated part in a desired orientation for selection.

26. The system of claim 1, further comprising a selector for removing from said support parts having a predetermined orientation as detected by said machine vision system.

27. The system of claim 1, wherein said transformer includes a controller for operating said transformer in a plurality of modes, including a first mode for applying an amplitude-controlled impulse of energy to said flexible surface based on the detected positional state of at least one part by said machine vision system.

28. The system of claim 27, wherein said controller operates said transformer in a second mode for applying impulse energy to said flexible surface at a predetermined frequency while said transformer moves relative to said flexible surface.

29. The system of claim 27, wherein the controller operates the transformer in a third mode for vibrating said flexible surface at a predetermined frequency while said transformer moves along a path relative to said flexible surface.

30. The system of claim 27, wherein the controller operates the transformer in a fourth mode for applying impulse energy to said flexible surface at a location corresponding to the center between at least two parts on said flexible surface sensed by said machine vision system to be touching.

31. A method for controlling the positional state of parts in a selection zone for removal by a selection mechanism, comprising:
supporting the parts in a selection zone with a flexible membrane;
detecting at least one positional parameter defining the positional state of at least one part in the selection zone;
selectively applying impulse energy to said flexible membrane responsive to the detected at least one positional parameter so as to selectively change the positional state of at least one part in said selection zone to a predetermined selection state.

32. The method of claim 31, further comprising he step of removing those parts in said selection zone hat are detected as being in said selection state.

33. The method of claim 31, wherein the positional state of parts is effected without recirculation of parts through said selection zone.

34. The method of claim 31, wherein impulse energy is applied to the flexible membrane by a hammer movable into and out of contact with the flexible membrane.

35. The method of claim 34, wherein the hammer is moved in a plane parallel to the flexible membrane based on the detected at least one positional parameter.

36. The method of claim 31, wherein said applying step applies at least one energy impulse of selected magnitude at at least one selected location of said flexible membrane responsive to the detected at least one positional parameter to relocate and/or reorient at least one part on said flexible membrane.

37. The method of claim 36, wherein said at least one energy impulse is applied responsive to the detected location and orientation of a detected singulated part to transform the orientation of said singulated part to a desired orientation.

38. The method of claim 31, further comprising the step of localizing the impulse energy applied to said flexible membrane.

39. The method of claim 31, wherein the detecting step compares the detected orientation of a selected part with a predetermined orientation, and said impulse energy is applied to said flexible membrane based on the energy required to reorient the selected part from the detected orientation to the predetermined orientation.

40. The method of claim 31, wherein said detecting step detects the relationship of parts relative to each other on said flexible membrane and applies at least one energy impulse to said flexible membrane responsive to said detected parts relationship so as to separate tangled or clustered parts.

41. The method of claim 31, further comprising supplying parts to said support in dependence on the total number of parts and/or the number of parts in a predetermined state as detected in the detecting step.

42. The method of claim 31, wherein said predetermined selection state corresponds to a singulated part in a desired orientation for selection.

* * * * *